(12) United States Patent
Asada et al.

(10) Patent No.: US 11,309,834 B2
(45) Date of Patent: Apr. 19, 2022

(54) HIGH-POWER TERAHERTZ OSCILLATOR

(71) Applicant: TOKYO INSTITUTE OF TECHNOLOGY, Tokyo (JP)

(72) Inventors: Masahiro Asada, Tokyo (JP); Safumi Suzuki, Tokyo (JP); Hiroki Tanaka, Tokyo (JP)

(73) Assignee: TOKYO INSTITUTE OF TECHNOLOGY, Tokyo (JP)

( * ) Notice: Subject to any disclaimer, the term of this patent is extended or adjusted under 35 U.S.C. 154(b) by 0 days.

(21) Appl. No.: 17/290,811

(22) PCT Filed: Nov. 19, 2019

(86) PCT No.: PCT/JP2019/045251
§ 371 (c)(1),
(2) Date: May 3, 2021

(87) PCT Pub. No.: WO2020/105627
PCT Pub. Date: May 28, 2020

(65) Prior Publication Data
US 2021/0328550 A1    Oct. 21, 2021

(30) Foreign Application Priority Data

Nov. 19, 2018    (JP) .............................. JP2018-216285

(51) Int. Cl.
*H03B 5/18* (2006.01)
*H01Q 1/38* (2006.01)
(Continued)

(52) U.S. Cl.
CPC .......... *H03B 5/1817* (2013.01); *H01L 29/88* (2013.01); *H01Q 1/38* (2013.01); *H01Q 9/28* (2013.01);
(Continued)

(58) Field of Classification Search
CPC .......... H03B 5/1817; H03B 7/08; H03B 7/14; H03B 2200/0084; H01Q 1/38; H01Q 9/28; H01L 29/88
(Continued)

(56) References Cited

U.S. PATENT DOCUMENTS 8,816,785 B2 * 8/2014 Sekiguchi ................ H03B 7/08
331/107 T
2003/0206708 A1 * 11/2003 Estes ...................... B82Y 20/00
385/130
(Continued)

FOREIGN PATENT DOCUMENTS

JP    2006-210585    8/2006
JP    2007-124250    5/2007
(Continued)

OTHER PUBLICATIONS

International Search Report dated Jan. 21, 2020 in International (PCT) Application No. PCT/JP2019/045251.
(Continued)

*Primary Examiner* — Arnold M Kinkead
(74) *Attorney, Agent, or Firm* — Wenderoth, Lind & Ponack, L.L.P.

(57) ABSTRACT

A small-size high-power terahertz oscillator achieves a stable oscillation in a terahertz frequency band even at room temperature. The high-power terahertz oscillator has a structure in which a bow-tie antenna is disposed on a substrate, a cavity resonator, which includes two cavities, is disposed at a power supply portion of the bow-tie antenna, and a resonant tunneling diode (RTD) is disposed along a bottom of a wall of the cavity resonator, which defines the two cavities, and stably oscillates waves in the terahertz frequency band at room temperature by using the RTD, the bow-tie antenna and the cavity resonator.

8 Claims, 9 Drawing Sheets

(51) Int. Cl.
*H03B 7/08* (2006.01)
*H03B 7/14* (2006.01)
*H01Q 9/28* (2006.01)
*H01L 29/88* (2006.01)

(52) U.S. Cl.
CPC ............... *H03B 7/08* (2013.01); *H03B 7/14* (2013.01); *H03B 2200/0084* (2013.01)

(58) Field of Classification Search
USPC ................................................. 331/107 T, 96
See application file for complete search history.

(56) References Cited

U.S. PATENT DOCUMENTS

| 2014/0266477 | A1 | 9/2014 | Sekiguchi et al. |
| 2017/0250458 | A1 | 8/2017 | Diebold et al. |

FOREIGN PATENT DOCUMENTS

| JP | 2013-171966 | 9/2013 |
| JP | 2014-200065 | 10/2014 |
| JP | 2017-157907 | 9/2017 |
| WO | 2015/170425 | 11/2015 |

OTHER PUBLICATIONS

M. Asada, S. Suzuki, and N. Kishimoto, "Resonant Tunneling Diodes for Sub-Terahertz and Terahertz Oscillators", Japanese Journal of Applied Physics, vol. 47, No. 6, pp. 4375-4384, 2008.

M. Asada and S. Suzuki,, "Room-Temperature Oscillation of Resonant Tunneling Diodes Close to 2THz and Their Functions for Various Applications", Journal of Infrared, Millimeter, and Terahertz Waves, vol. 37, pp. 1185-1198, 2016.

\* cited by examiner

PRIOR ART

PRIOR ART

HIGH-POWER TERAHERTZ OSCILLATOR

TECHNICAL FIELD

The present invention relates to a terahertz oscillator that oscillates waves whose frequency is in a terahertz frequency band, which is in a range of about 0.1 [THz] to about 10 [THz] between radio waves and light, and stably outputs an oscillation frequency with high-power at a room temperature, and in particular, to the high-power terahertz oscillator in which a cavity resonator having two cavities and a bow-tie antenna including two conducting strips are integrated with a resonant tunneling diode (RTD) device having semiconductor nanostructures.

BACKGROUND ART

A terahertz (THz) frequency band, which is in a range of about 0.1 [THz] to about 10 [THz] between radio waves and light, is an undeveloped frequency band. If a device which oscillates waves in the terahertz (THz) frequency band is put to a practical use, the terahertz oscillator is expected to be applied to various fields such as imaging technology and high-speed communications. For the above use, it is indispensable to develop the small-size terahertz oscillator. As one example, the terahertz oscillator including a resonant tunneling diode (RTD) device having semiconductor nanostructures have been studied. Currently, this terahertz oscillator is an only electronic device which enables to oscillate the waves whose frequency is in a range of 1 [THz] to 2 [THz] at the room temperature even by itself. However, there is a problem that the output of this terahertz oscillator is about 10 [μW] and is very low power, and the applications of this terahertz oscillator are limited to narrow fields.

FIG. 1 shows a conventional terahertz oscillator, a lower electrode 4 is stacked on an indium phosphide (hereinafter, referred to as "InP") substrate 3 whose shape is a square having about 1 [mm] length, and a slot antenna 2 whose configuration is a rectangular recess (the dimension is about 10 to 20 [μm]) is disposed at the substantially center portion of the lower electrode 4. An upper electrode 5 and a stabilizing resistor 6 are also disposed on the InP substrate 3, and the resonant tunneling diode (RTD) 1, which has a negative current-voltage (I-V) characteristics as shown in FIG. 3, is disposed at an edge portion of the upper electrode 5 via a MIM (Metal-Insulator-Metal) capacitor 7. The stabilizing resistor 6 is connected between the lower electrode 4 and the upper electrode 5 for stabilizing the oscillation operation, and the stabilizing resistor 6 includes, for example, an indium gallium arsenide (InGaAs) sheet. When a bias voltage by a DC bias is applied to the resonant tunneling diode 1, an electron is tunneling through a quantum level of a quantum well and a tunnel current is flowed. In a case that the applied bias voltage further increases, since the electron cannot be tunneling and the current decreases when the quantum level in the quantum well is lower than a bottom of a conduction band of an emitter, the I-V characteristics shown in FIG. 3 are obtained. By using negative differential conductance characteristics "$-G_{RTD}$" in which the current decreases when the bias voltage increases, the electromagnetic wave can be oscillated and be amplified. Further, the resonant tunneling diode 1 has the negative differential conductance "$-G_{RTD}$" and a parasitic capacitance "$C_{RTD}$" in parallel, and the electromagnetic wave is radiated in a vertical direction to a standing wave of an electric field as shown in FIG. 2. Because the slot antenna 2 is represented by an LC-resonant circuit and a radiation loss "$G_{ant}$", an equivalent circuit of this oscillator is indicated by the equivalent circuit shown in FIG. 4. A condition required for the oscillation is a case that the positive value "$G_{RTD}$" of the negative differential conductance characteristics becomes the radiation loss "$G_{ant}$" or more, as shown in a following Expression 1, and the oscillation frequency "$f_{OSC}$" is represented by a following Expression 2.

$$G_{RTD} \geq G_{ant} \qquad \text{[Expression 1]}$$

$$f_{OSC} = \frac{1}{2\pi\sqrt{L_{ant}(G_{ant} + G_{RTD})}} \qquad \text{[Expression 2]}$$

Since the inductance of the slot antenna 2 is high, in order that the oscillation frequency $f_{OSC}$ becomes the frequency in the terahertz frequency band, it is needed that the capacitance of the resonant tunneling diode 1 is lowered. Therefore, it is required for reducing a mesa area of the resonant tunneling diode 1 (an area of the upper surface). For the above requisition, the current flowing through the resonant tunneling diode 1 decreases, and there exists a trade-off problem that the output of the resonant tunneling diode 1 decreases when the oscillation frequency is higher. In a case that the length of the slot antenna 2 is set as short as possible, the inductance of the slot antenna 2 becomes lower and the oscillation frequency of the resonant tunneling diode 1 becomes higher. However, even in this case, there also exists a trade-off problem that the output of the resonant tunneling diode 1 decreases because the radiation resistance of the slot antenna 2 becomes higher.

THE LIST OF PRIOR ART DOCUMENTS

Patent Documents

Patent Document 1: Japanese Unexamined Patent Publication No. 2013-171966 A
Patent Document 2: Japanese Unexamined Patent Publication No. 2006-210585 A
Patent Document 3: WO 2015/170425 A1

Non-Patent Documents

Non-Patent Document 1: M. Asada, S. Suzuki, and N. Kishimoto, "Resonant tunneling diodes for sub-terahertz and terahertz oscillators", Japanese Journal of Applied Physics, vol. 47, no. 6, pp. 4375-4384, 2008.
Non-Patent Document 2: M. Asada and S. Suzuki, "Room-temperature oscillation of resonant tunneling diodes close to 2 THz and their functions for various applications", Journal of Infrared, Millimeter, and Terahertz Waves, vol. 37, pp. 1185-1198, 2016.

SUMMARY OF THE INVENTION

Problems to be Solved by the Invention

As shown in Japanese Unexamined Patent Publication No. 2006-210585 A (Patent Document 2), the terahertz oscillator using an intrinsic Josephson junction in a superconductive layer and an insulating layer is proposed, and the oscillation frequency in the oscillator using this superconductive device is variable. However, the terahertz oscillator disclosed in Patent Document 2 has the problems that the oscillation phenomenon is limited to be operated only at a cryogenic temperature and the superconductive layer has to be retained and be controlled at the cryogenic temperature. Accordingly, it is desired that the high-power terahertz oscillator operates at the room temperature.

Further, in WO 2015/170425 A1 (Patent Document 3), it is proposed that the terahertz oscillator in which a varactor diode is disposed in parallel with the resonant tunneling diode, oscillates the waves by independently applying the DC voltages to the varactor diode and the resonant tunneling diode. According to this terahertz oscillator, the terahertz frequency is continuously variable at a normal temperature, but the output is about 0.3 [μW] to about 10 [μW] and is low-power. Thus, the terahertz oscillator outputting the high-power and operating at the room temperature is also desired.

The present invention has been developed in view of the above-described circumstances, and an object of the present invention is to provide a small-size high-power terahertz oscillator that achieves the stable oscillation in the terahertz frequency band even at the room temperature.

Means for Solving the Problems

The present invention relates to a high-power terahertz oscillator, and the above-described object of the present invention is achieved by the high-power terahertz oscillator, comprising: a bow-tie antenna, which includes first and second conductor strips, disposed on a substrate; a cavity resonator, which includes two cavities, disposed at an oscillating portion of the bow-tie antenna; and a resonant tunneling diode, which is cuboid, disposed along a bottom of a wall which defines the two cavities, wherein oscillation in the terahertz frequency band is obtained from the resonant tunneling diode, the bow-tie antenna and the cavity resonator, by applying a bias voltage between the second conductor strip of the bow-tie antenna and a side surface or a top surface of the cavity resonator connected to the first conductor strip of the bow-tie antenna.

The above-described object of the present invention is efficiently achieved by wherein a bottom surface of the resonant tunneling diode is in contact with a top surface of the second conductor strip of the bow-tie antenna, or wherein the first conductor strip of the bow-tie antenna is integrated with the cavity resonator, or wherein the first and second conductor strips of the bow-tie antenna and the cavity resonator are made of a good conductor, and the substrate is made of a semi-insulator, or wherein an insulating thin film is disposed between the first and second conductor strips of the bow-tie antenna and is disposed between a bottom of the cavity resonator and the second conductor strip of the bow-tie antenna, or wherein a recess is formed at the second conductor strip of the bow-tie antenna, a conductor bridge extending from the cavity resonator is connected to an upper surface of the substrate in the recess, and a stabilizing resistor is connected between the conductor bridge and a side surface of the second conductor strip of the bow-tie antenna.

Effects of the Invention

In the conventional slot antenna integrated resonant tunneling diode oscillator, the output is about 10 [μW] where the oscillation frequency is around 1 [THz]. Using the high-power terahertz oscillator according to the present invention, the output is about 7 [mW] where the oscillation frequency is around 1 [THz] and an about 700 times improvement in the output is obtained. Further, the high-power terahertz oscillator according to the present invention stably oscillates the waves at the room temperature.

MODE FOR CARRYING OUT THE INVENTION

Figure 1:
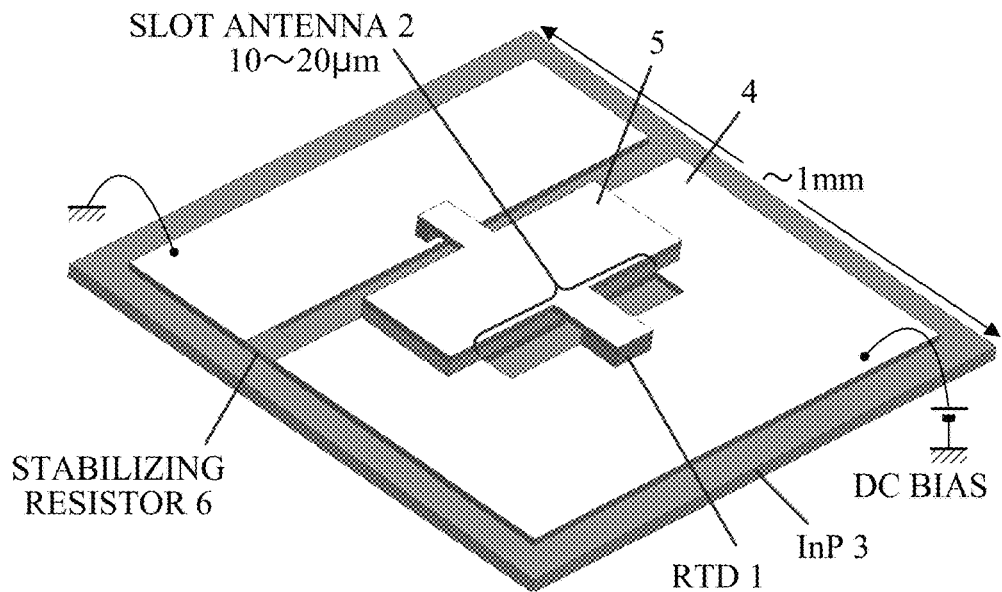
FIG. 1 is a perspective structure diagram showing one example of a terahertz oscillator including a conventional resonant tunneling diode.
Figure 2:
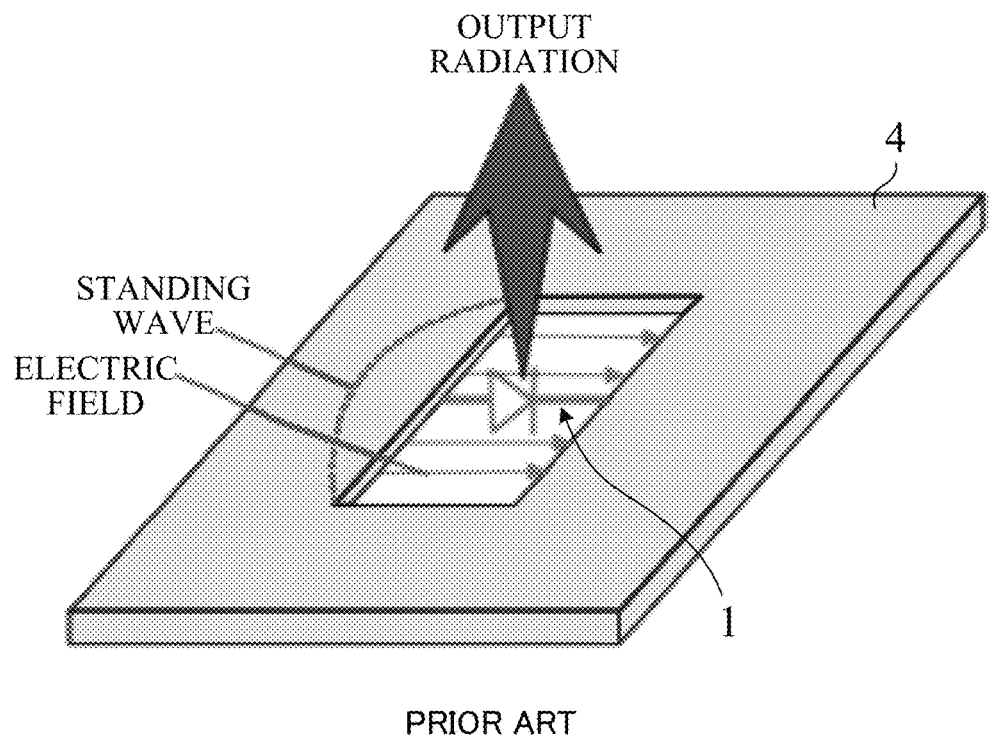
FIG. 2 is a schematic view showing an example of an output behavior of the terahertz oscillator including the conventional resonant tunneling diode.
Figure 3:
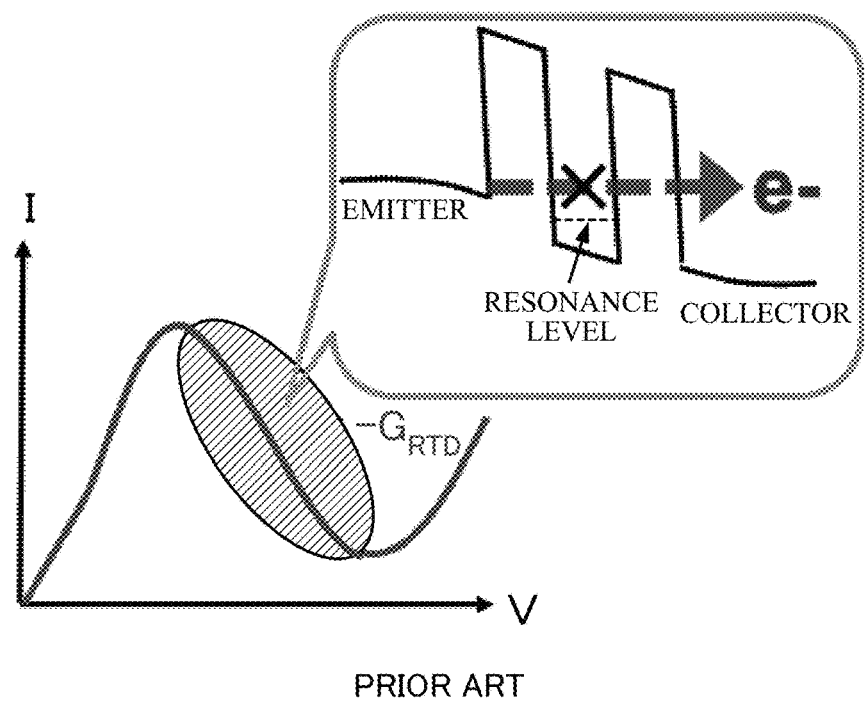
FIG. 3 is a characteristic diagram showing a characteristic example of the resonant tunneling diode.
Figure 4:
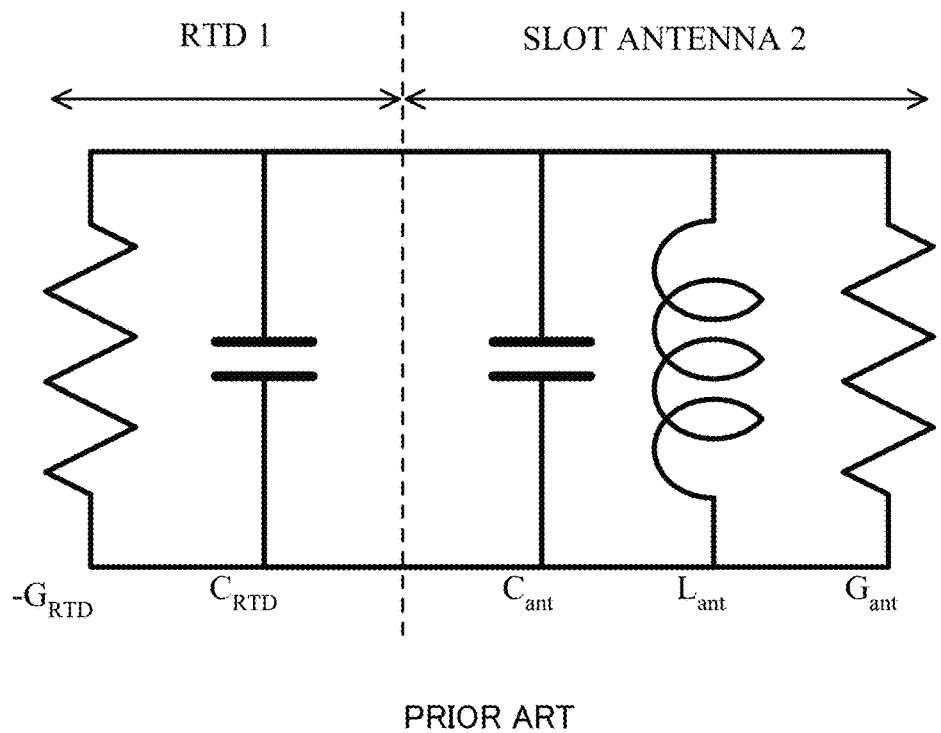
FIG. 4 is an equivalent circuit diagram of the terahertz oscillator including the conventional resonant tunneling diode.

In a terahertz oscillator including a resonant tunneling diode device (hereinafter, referred to as "RTD") having semiconductor nanostructures, the present invention investigates a cause of a low-power output in a conventional slot antenna integrated RTD oscillator, and proposes a small-size terahertz oscillator having a novel structure (the dimension is (width about 1 [mm])×(length about 1 [mm])×(height a few μm)) in which a cavity resonator having two cuboid cavities and a bow-tie antenna (a bow-tie angle θ) including two conductor strips are integrated with the RTD, as a means of resolving the cause of the low-power output. That is, instead of using the conventional slot antenna, the cavity resonator having two cavities, which are a cuboid whose cross-section is a rectangle or a trapezoidal body whose cross-section is a trapezoid, is disposed at a resonant portion of the bow-tie antenna which determines an oscillation frequency. The two cavities of the cavity resonator are defined by a wall hanging from a ceiling. Further, an output radiation of the oscillator is performed by the bow-tie antenna which is spatially separated from the cavity resonator, the cuboid RTD whose cross-section is a rectangle is disposed between a bottom surface portion of the wall of the cavity resonator and one of the conductor strips of the bow-tie antenna, and a bias voltage is applied to the RTD by an upper electrode connected to the cavity resonator and a lower electrode connected to the other of the conductor strips of the bow-tie antenna. In other words, the upper electrode of the RTD is the bottom surface portion of the wall, and the lower electrode of the RTD is a top surface of the bow-tie antenna. A power supply portion is constituted by one side of the bow-tie antenna (the other of the conductor strips) and a part of the cavity resonator (a side surface or a top surface) connected to one of the conductor strips which is opposite to one side of the bow-tie antenna.

The cavity resonator including the ceiling and the wall is made of good conductor such as gold (Au), copper (Cu), silver (Ag) or platinum (Pt), and the bow-tie antenna including the two conductor strips is also made of the good conductor such as the gold (Au), the copper (Cu), the silver (Ag) or the platinum (Pt).

Since an area in which a high-frequency current is flown becomes larger in the cavity resonator, an inductance can largely be reduced in comparison with the slot antenna, and the oscillation frequency can be higher without decreasing the capacitance of the RTD. Because a negative differential conductance become larger by increasing a mesa area of the RTD, a high-power output can be obtained in the terahertz oscillator according to the present invention.

By adopting the oscillator structure of the present invention, the high-power output which is two orders or more of magnitude (about 2 [mW] to about 7 [mW]) in comparison with the output of the conventional structure is confirmed to be obtained at 1 [THz] belong to the terahertz frequency band and the room temperature by a simulation.

Embodiments of the present invention will be described with reference to the accompanying drawings as follows.

Figure 5:
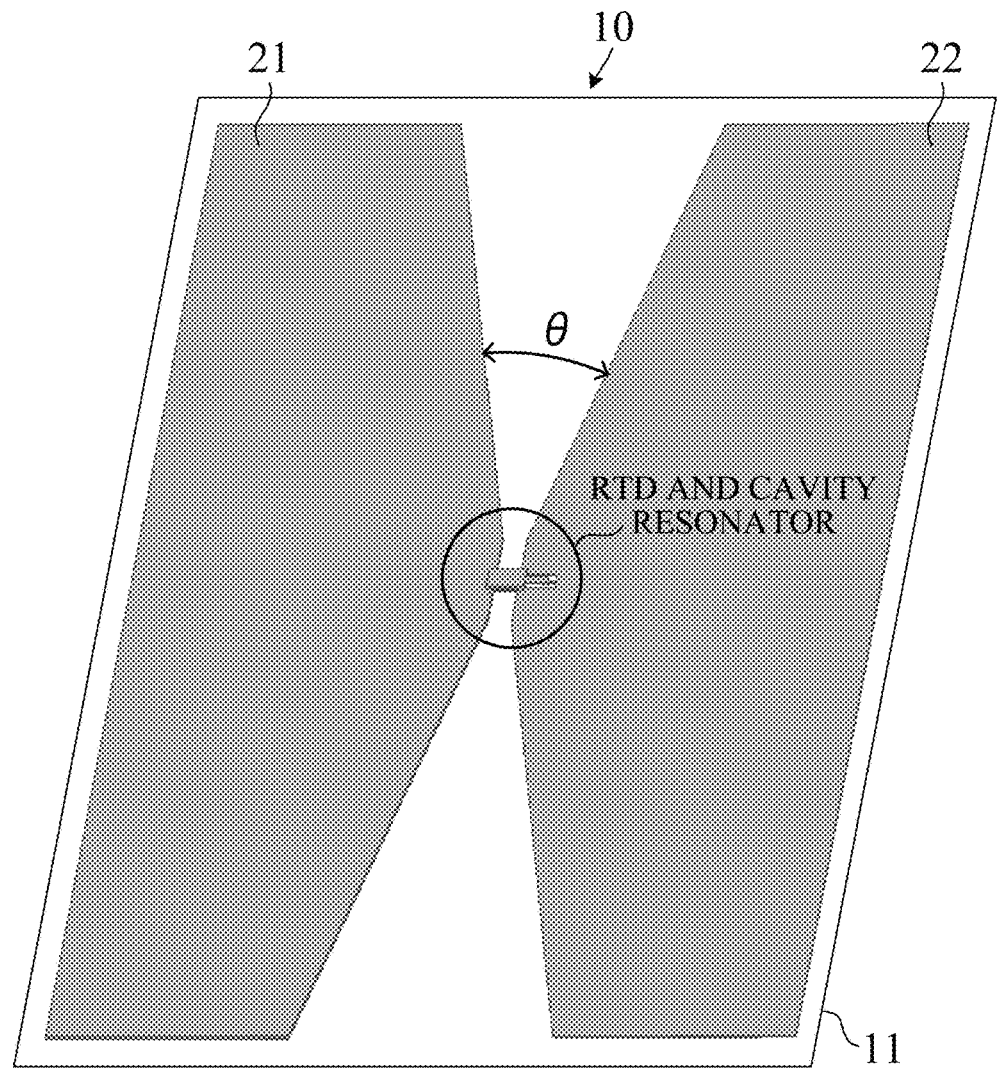
FIG. 5 is a perspective view showing a configuration example of a high-power terahertz oscillator according to the present invention.

FIG. 5 is a perspective view of the high-power terahertz oscillator 10 according to the present invention, and the bow-tie antenna 20, which is made of the good conductor such as the gold (Au) and includes the two conductor strips 21 and 22 having a bow-tie angle θ, is disposed on an upper surface of a semi-insulating substrate (SI) substrate 11 including indium phosphide (InP) whose shape is a square having about 1 [mm] length and height is a few μm. The conductor strips 21 and 22 of the bow-tie antenna 20 have line symmetry, a shape of the conductor strips 21 and 22 is substantially a rectangle, inclinations toward both ends are provided with an oscillating portion in which the conductor strips 21 and 22 are opposite, as shown in FIG. 5, and the bow-tie angle θ is formed by both the inclination angles of the conductor strips 21 and 22. The conductor strips 21 and 22 are made of the good conductor such as the gold (Au).

Figure 6:
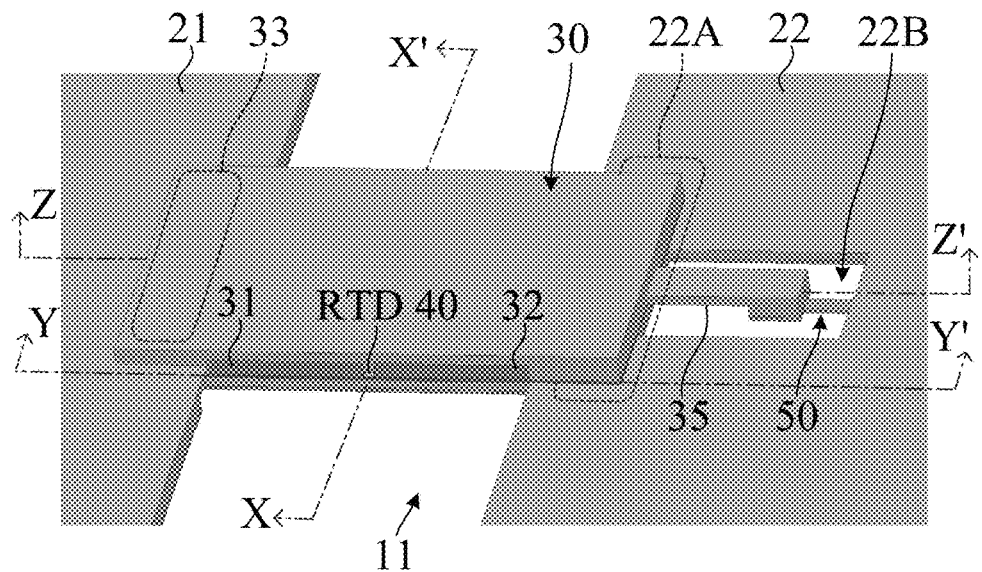
FIG. 6 is a partially detailed diagram of the high-power terahertz oscillator according to the present invention.
Figure 7:
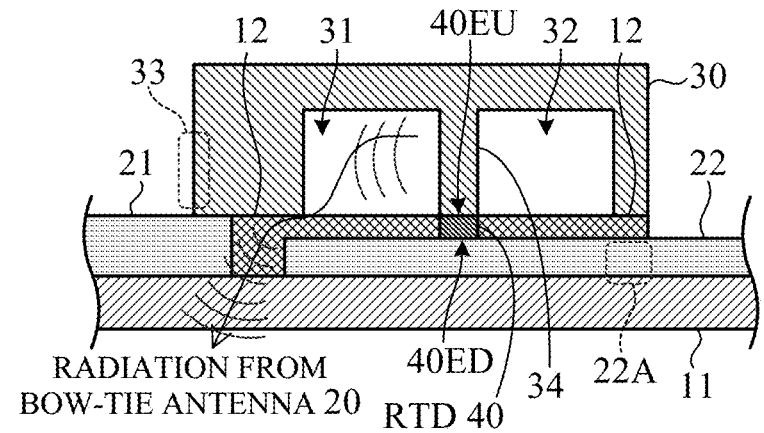
FIG. 7 is a cross-sectional view showing a cross-sectional structure example of the terahertz oscillator according to the present invention, taken along a Y-Y' direction in FIG. 6.
Figure 8:
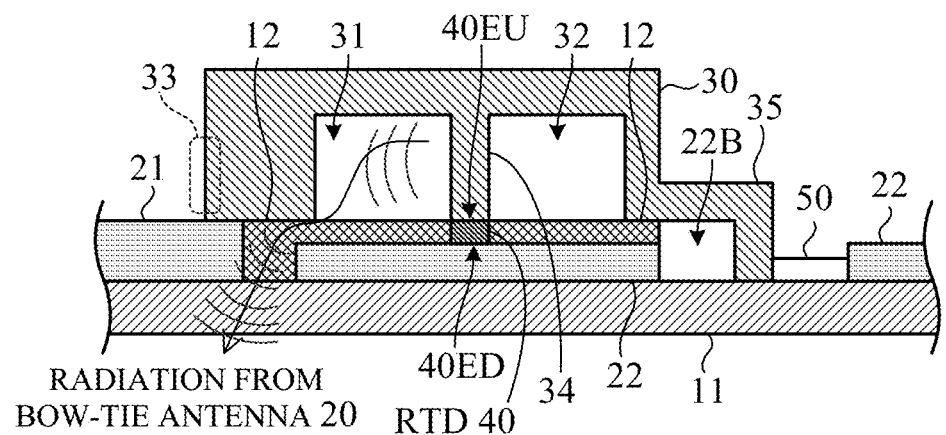
FIG. 8 is a cross-sectional view showing a cross-sectional structure example of the terahertz oscillator according to the present invention, taken along a Z-Z' direction in FIG. 6.
Figure 9A:
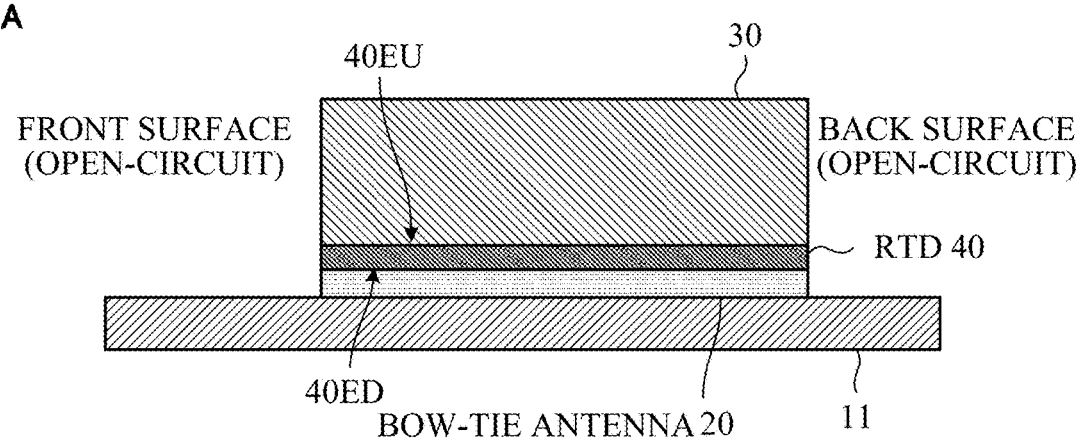
FIGS. 9A to 9C are a cross-sectional view showing a cross-sectional structure example of the terahertz oscillator according to the present invention, taken along an X-X' direction in FIG. 6, and a cross-sectional structure example of other modification examples

The RTD 40 and the cavity resonator 30 are disposed at the oscillating portion in which the two conductor strips 21 and 22 of the bow-tie antenna 20 are opposite, and a detailed perspective view is shown in FIG. 6. The Y-Y' cross-section, the Z-Z' cross-section and the X-X' cross-section are shown in FIG. 7, FIG. 8 and FIG. 9A, respectively. The cavity resonator 30 is also made of the good conductor such as the gold (Au). In FIGS. 7 and 8, the conductor strip 21 of the bow-tie antenna 20 and the cavity resonator 30 are separated for easily identifying. In actual, the conductor strip 21 of the bow-tie antenna 20 and the cavity resonator 30 are an integrated structure which is made of the good conductor such as the gold (Au). Since both the conductor strip 21 of the bow-tie antenna 20 and the cavity resonator 30 are made of the good conductor, the conductor strip 21 of the bow-tie antenna 20 and the cavity resonator 30 may be separated and may have a contact structure.

As shown in FIGS. 5 to 8, the two conductor strips 21 and 22, which constitute the bow-tie antenna 20 and have the bow-tie angle θ, are disposed on the semi-insulating (SI) substrate 11 made of "InP", and the cavity resonator 30 having the two cuboid cavities 31 and 32 whose cross-section is rectangle is disposed on the respective surfaces of the two conductor strips 21 and 22 of the bow-tie antenna 20. A part of the conductor strip 22 of the bow-tie antenna 20 serves as the power supply portion 22A for applying the bias voltage (DC voltage), and a part of the cavity resonator 30 (the side surface or the top surface) which is opposite to the conductor strip 22 serves as the power supply portion 33 for applying the bias voltage (DC voltage).

As shown in FIGS. 6 to 8, the two cavities 31 and 32 of the cavity resonator 30 are defined by the plate wall 34 hanging from a center of the ceiling. In the present example, as shown in FIG. 9A, both the front surface and the back surface of the cavities 31 and 32 are open-circuit (opening). The cuboid RTD 40 whose cross-section is a rectangle is disposed between the bottom of the wall 34 of the cavity resonator 30 and the upper surface of the conductor strip 22 of the bow-tie antenna 20. As shown in FIG. 9A, the RTD 40 is extended from the front surface (open-circuit) of the cavities 31 and 32 to the back surface (open-circuit) of the cavities 31 and 32. The bottom surface of the cavity resonator 30 and the conductor strip 22 of the bow-tie antenna 20 are separated by the insulating thin film 12 whose thickness is the same as that of the RTD 40 (about 2 [μm]). The insulating thin film 12 is extended to an outside of the cavity 31, and is downwardly bent at the outside of the cavity 31 so that the conductor strip 21 is electrically insulated from the conductor strip 22. The insulating thin film 12 whose cross-section is an L-shape is made of an insulating material such as silicon dioxide "$SiO_2$".

As shown in FIGS. 6 and 8, for example, a rectangular recess 22B is provided at a proximate portion of the cavity resonator 30 in the conductor strip 22 of the bow-tie antenna 20, and the L-shape conductor bridge 35 extending from the side surface of the cavity resonator 30 is disposed in the recess 22B. A stabilizing resistor 50 whose resistance value is "Rs" and which is made of, for example, "InGaAs" and is disposed on the bottom of the recess 22B, is connected to the conductor bridge 35, and the stabilizing resistor 50 is connected to the facing side surface of the conductor strip 22. The stabilizing resistor 50 suppresses a parasitic oscillation whose frequency is a few GHz, resulting in obtaining the stable terahertz oscillation. The conductor bridge 35 has a function of an inductance "Ls". Because the opening surface of the cavity resonator 30 and the stabilizing resistor 50 are connected in this structure, the loss is not occurred and then the output power is not limited due to the above connection.

Here, the shape of the recess 22B is not limited to the rectangle, and may be an ellipse or a circle.

The bias voltage from one of the power supply portions 22A applying the bias is applied to the conductor strip 22 of the bow-tie antenna 20, and the lower electrode 40ED of the RTD 40 serves as one of the power supply portions 22A via the conductor strip 22. The bias voltage from the other of the power supply portions 33 is applied to the side surface or the top surface of the cavity resonator 30, and the upper electrode 40EU of the RTD 40 serves as the other of the power supply portions 33 via the wall 34 of the cavity resonator 30. The output from the oscillation circuit is radiated between the electrodes (the conductor strips 21 and 22) of the bow-tie antenna 20 via the side surface and the bottom surface of the insulating thin film 12. Since the insulating thin film 12 is sufficiently thin (about 2 [μm]), the connection between the cavity resonator 30 and the bow-tie antenna 20 is small and then the radiation resistance "Ra" of the bow-tie antenna is not almost affected from the cavity resonator 30.

By implementing such a structure, the oscillation circuit is constituted by the cavity resonator 30 and the RTD 40. The oscillation frequency is determined by the inductance of the cavity resonator 30 and the capacitance of the RTD 40. Since the inductance of the cavity resonator 30 is small, the RTD which has a large mesa area and a large capacitance can be used, and the high-power output can be realized by using the RTD 40 having the large mesa area.

Figure 10:
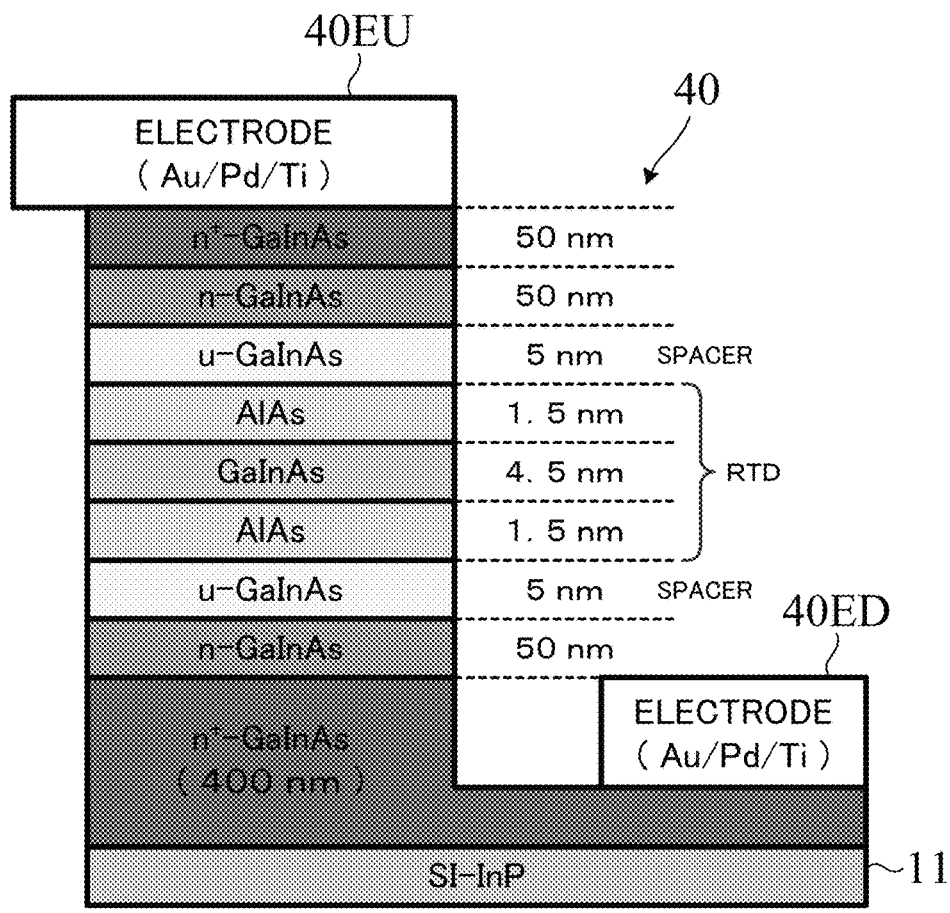
FIG. 10 is a schematic view showing a cross-sectional structure example of the resonant tunneling diode.

A configuration example of the RTD 40 is shown in FIG. 10, and an "n$^+$-GaInAs" layer (400 [nm]), an "n-GaInAs" layer (50 [nnm]), a "u-GaInAs" layer (5 [nm]), an "AlAs" layer (1.5 [nm]), a "GaInAs" layer (4.5 [nm]), an "AlAs" layer (1.5 [nm]), a "u-GaInAs" layer (5 [nm]), an "n-GaInAs" layer (50 [nnm]), and an "n$^+$-GaInAs" layer (50 [nm]) are successively stacked between the lower electrode 40ED and the upper electrode 40EU, which are a 3-layer structure (Au/Pd/Ti) including the gold (Au), the palladium (Pd) and the titanium (Ti). As shown in FIGS. 7 and 8, the upper electrode 40EU is corresponding to the bottom of the wall 34 of the cavity resonator 30, and the lower electrode 40ED is corresponding to the upper surface of the conductor strip 22 of the bow-tie antenna 20. The lowermost layer in FIG. 10 is the semi-insulating substrate 11 (the "Si—InP" substrate).

Figure 11:
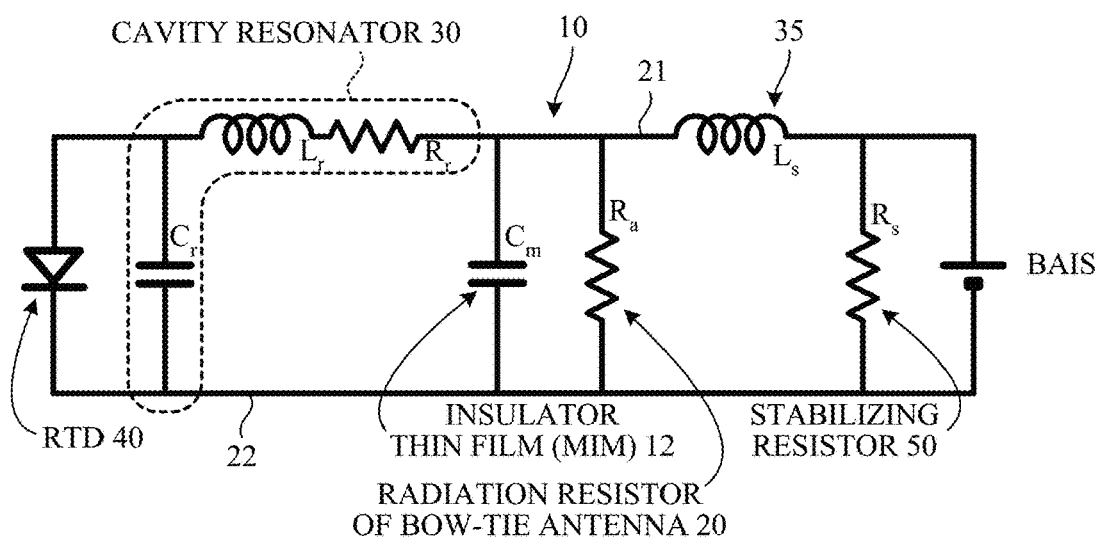
FIG. 11 is an equivalent circuit diagram of the terahertz oscillator according to the present invention.

FIG. 11 shows an equivalent circuit of the terahertz oscillator 10 according to the present invention. The radiation resistor "Ra" of the bow-tie antenna 20 is independent of the inductance "Lr" of the cavity resonator 30, and therefore the trade-off relationship between the oscillation frequency and the output power of the terahertz oscillator can be resolved. Thereby, the inductance "Lr" of the cavity resonator 30 can largely be reduced in comparison with that of the slot antenna, and the oscillation frequency can be higher without decreasing the capacitance of the RTD 40. Accordingly, the high-power output can be obtained by the large area RTD device having a large mesa area. In this RTD device, the radiation resistor "Ra" of the bow-tie antenna 20 has no relation to the inductance "Lr" of the cavity resonator 30.

Figure 12:
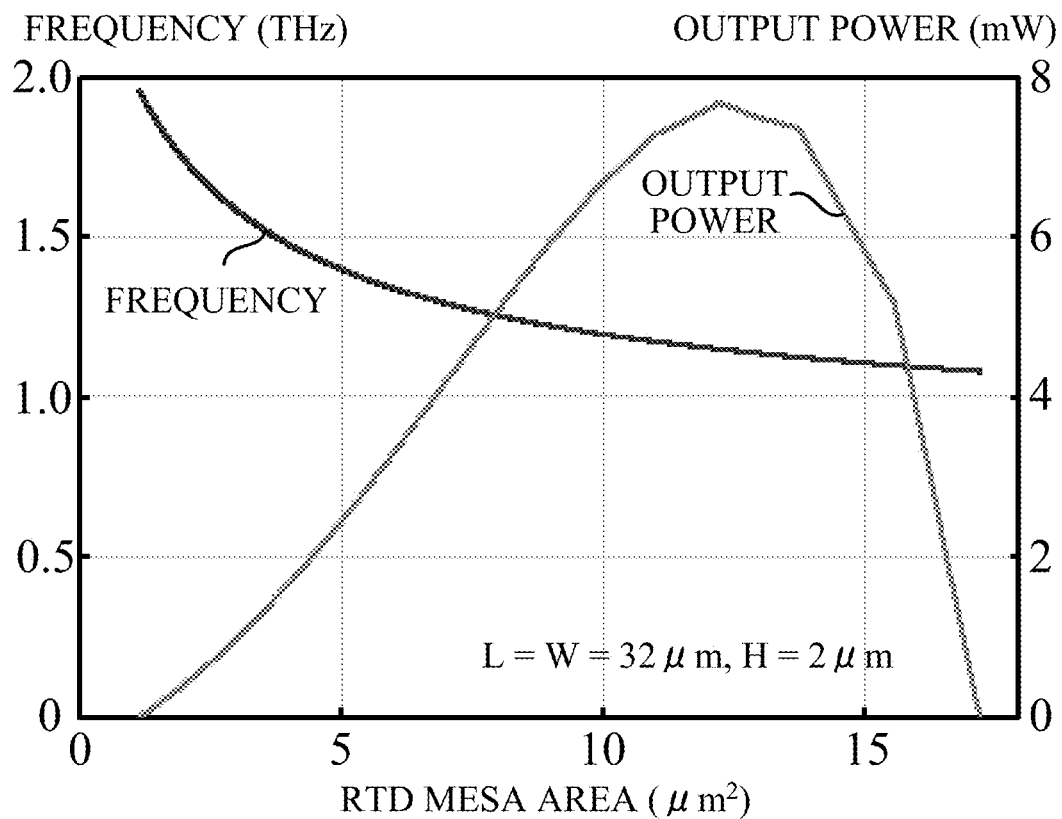
FIG. 12 is a characteristic diagram showing a characteristic example of the terahertz oscillator according to the present invention.

In a case that the actual structure and material of the RTD 40 are a "GaInAs/AlAs" on the InP substrate 11, the material of the electrodes is the gold (Au), and the material of the insulating thin film is the silicon dioxide (SiO$_2$), when the mesa area of the RTD 40 is variable, the simulation characteristics of the terahertz oscillator 10 according to the present invention are shown in FIG. 12. In the present example, the width "W" and the length "L" of the cavity resonator 30 are 32 [μm], and the height "H" is 2 [μm]. As is apparent from this simulation result, the frequency band is in a range of 1.0 [THz] to 2.0 {THz}, and the output power whose maximum value is about 8 [mW] is obtained. The bow-tie antenna 20 can vary the radiation impedance by changing the bow-tie angle θ, and the output power is enabled to be maximized by matching the radiation impedance with the components of the RTD 40.

Figure 9B:
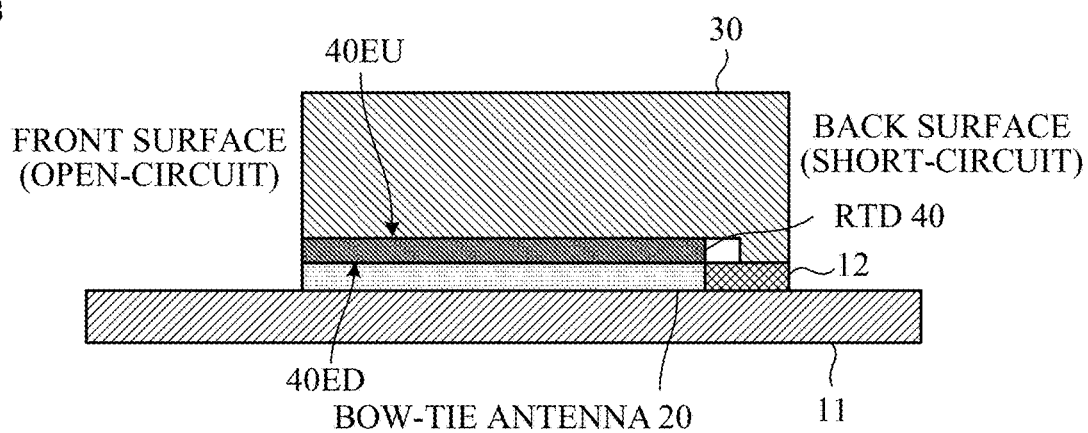

In the above example, both ends of the cavities 31 and 32 of the cavity resonator 30 are opened (open-circuit). In the example of FIG. 9B, one end of the cavities 30 is closed (short-circuit). Thereby, the standing waves in which the electric field is zero at the closed side (short-circuit side) are distributed, the cavity resonator 30 in FIG. 9B resonates with a higher frequency than the resonance frequency of the cavity resonator in FIG. 9A in which both ends are opened, and the oscillation frequency of the cavity resonator in FIG. 9B becomes higher than that of the cavity resonator in FIG. 9A.

Figure 9C:
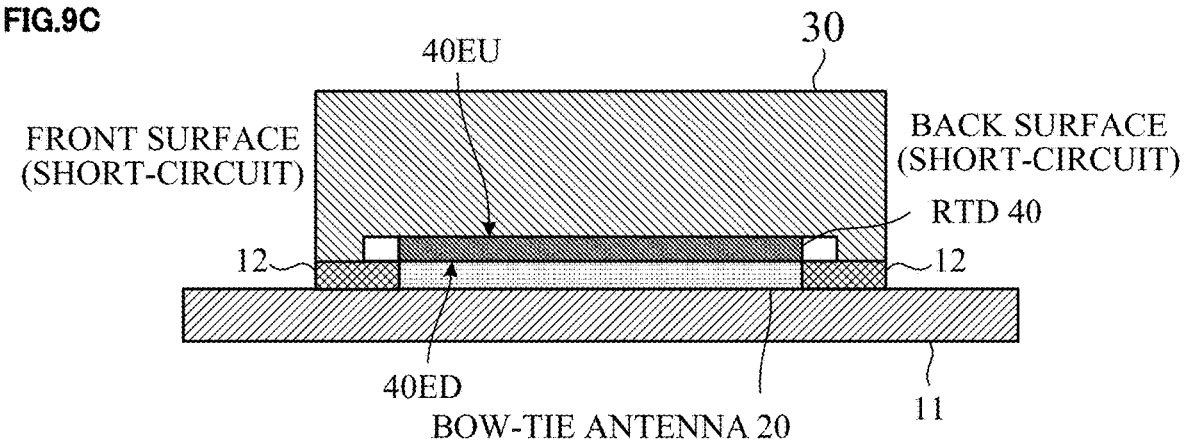

As shown in FIG. 9C, the structure in which both ends of the cavity resonator 30 are not opened but are closed may be adopted. In this case, the standing waves in which the electric field is zero at both ends are distributed, the cavity resonator 30 or in FIG. 9C resonates with a higher frequency than the resonance frequency of the cavity resonator in FIG. 9B in which only one end is closed, and the oscillation frequency of the cavity resonator 30 in FIG. 9C becomes further higher than that of the cavity resonator in FIG. 9B.

Figure 13:
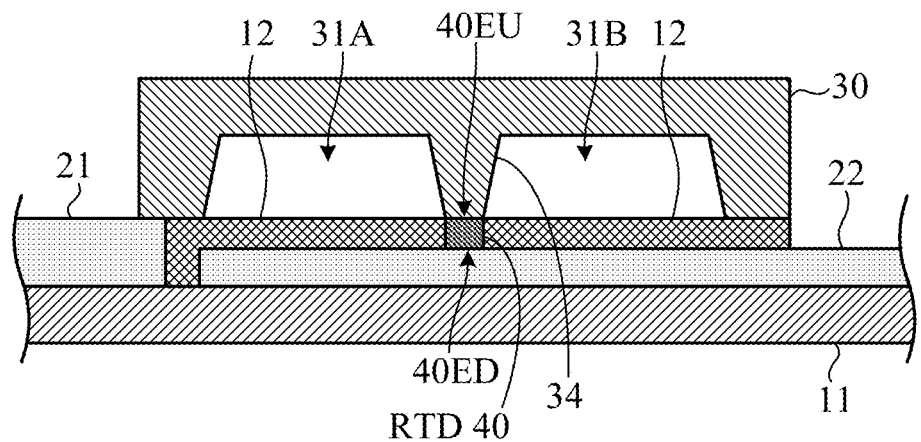
FIG. 13 is a cross-sectional view showing another structure example of a cavity resonator.

Further, although the cross-section of the cavities 31 and 32 of the cavity resonator 30 is a rectangle in the above examples, this cross-section may be a trapezoid as shown in FIG. 13.

Figure 14:
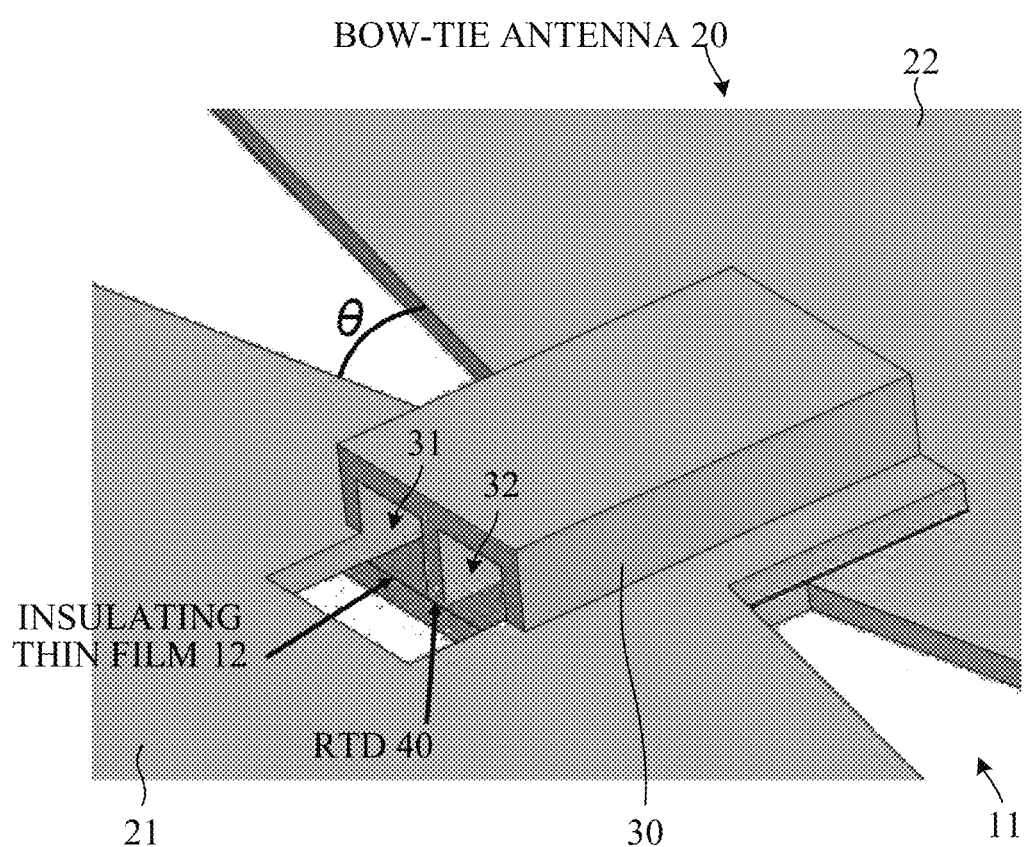
FIG. 14 is a perspective view showing another configuration example of the high-power terahertz oscillator according to the present invention.

Furthermore, in the above examples, the cavities 31 and 32 of the cavity resonator 30 are disposed in parallel with the bow-tie angle θ of the bow-tie antenna 20, that is, in parallel with the conductor strips 21 and 22. However, as shown in FIG. 14, the cavities 31 and 32 of the cavity resonator 30 may be disposed in a right angle direction to the resonant portions of the conductor strips 21 and 22. In the cavity resonator 30 in which both ends are an opening surface, the cuboid RTD 40 is disposed from one of the opening surfaces of the cavity resonator 30 to the other of the opening surfaces of the cavity resonator 30, and both opening surfaces are perpendicular to the cuboid RTD 40. The top portion and the bottom portion of the RTD 40 are connected to the inner top surface and the inner bottom surface of the cavity resonator 30, respectively. The bottom surface of the cavity resonator 30 is separated from other components by the insulating thin film 12 which is inserted between the bottom surface of the cavity resonator 30 and the side surface of the cavity resonator 30.

Figure 15:
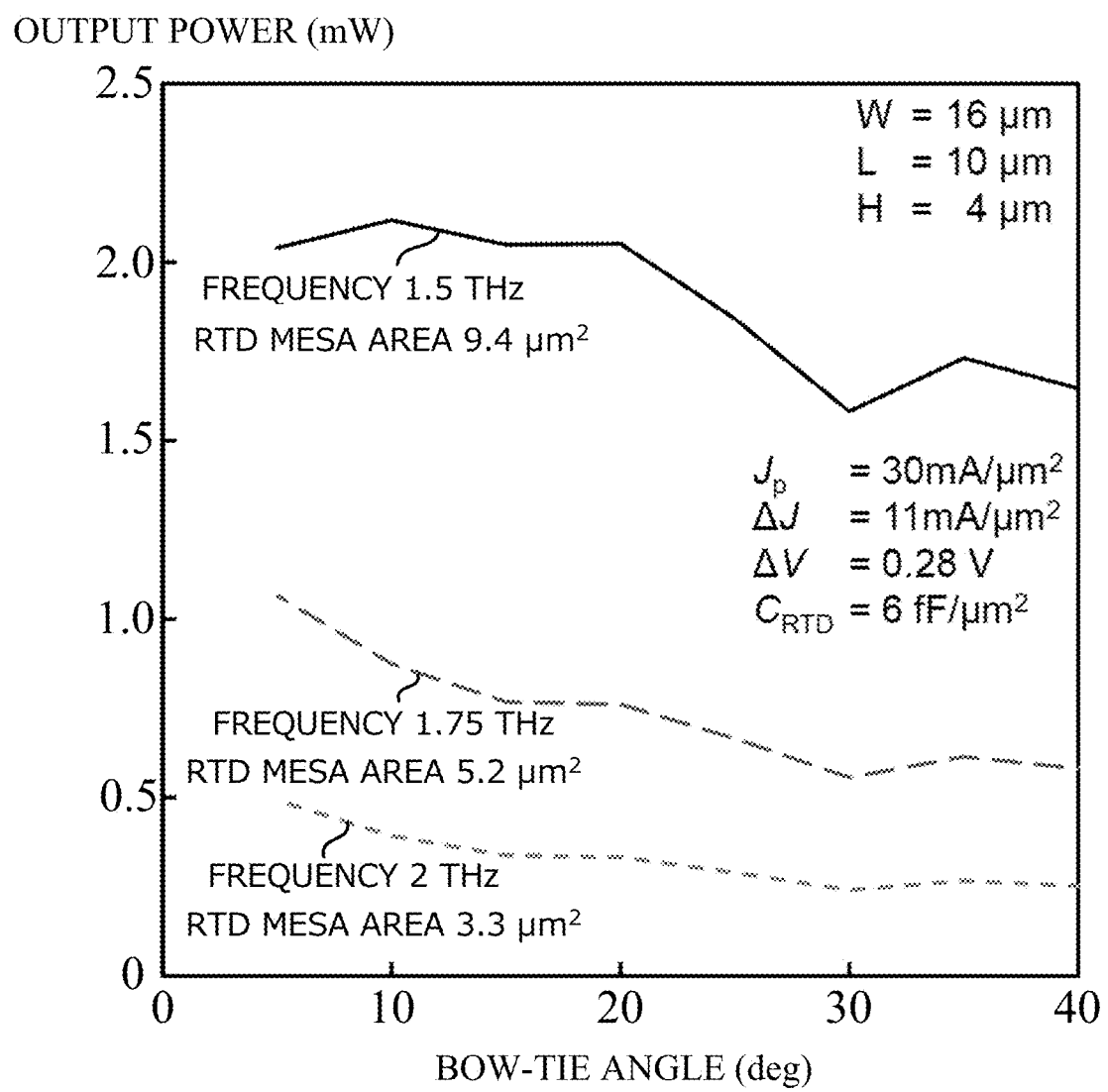
FIG. 15 is a characteristic diagram showing characteristic examples of the terahertz oscillator shown in FIG. 14.

In the structure shown in FIG. 14, by using an electromagnetic field simulator (HFSS (Trademark) manufactured by Ansys, Inc.), an admittance constituted by the cavity resonator 30 and the bow-tie antenna 20 is calculated, and the characteristics of the RTD 40 and the oscillation characteristics are analyzed, resulting in obtaining the characteristics shown in FIG. 15. In FIG. 15, the output power [mW] is obtained in a case that the bow-tie angle [deg] and the RTD mesa area are selected as parameters. By optimizing the bow-tie angle, it is expected that the output power which is 2 [mW] or more is obtained in a case that the oscillation frequency is 1.5 [THz].

INDUSTRIAL APPLICABILITY

By using the high-power terahertz oscillator according to the present invention, a compact chip, which measures absorption spectra of a material whose absorption spectra are existed in a terahertz frequency band, can be realized. It is considered that the high-power terahertz oscillator according to the present invention enables to facilitate a further development in the fields such as the imaging and the analysis in chemistry and medical regions, and a large-capacity wireless communications using the terahertz waves.

EXPLANATION OF REFERENCE NUMERALS 1 resonant tunneling diode (RTD)
2 slot antenna 3 substrate
4 lower electrode
5 upper electrode
6 stabilizing resistor
10 high-power terahertz oscillator
11 substrate (InP)
12 insulating thin film
20 bow-tie antenna
21, 22 conductor strip
30 cavity resonator
31, 32 cavity
34 wall
35 conductor bridge
40 resonant tunneling diode (RTD)
50 stabilizing resistor

The invention claimed is:

1. A high-power terahertz oscillator, comprising:
a bow-tie antenna, which includes first and second conductor strips, disposed on a substrate;
a cavity resonator, which includes two cavities, disposed at an oscillating portion of said bow-tie antenna;
a resonant tunneling diode, which is cuboid, disposed along a bottom of a wall which defines the two cavities; and
an insulating thin film disposed between said first and second conductor strips of said bow-tie antenna, and disposed between a bottom of said cavity resonator and said second conductor strip of said bow-tie antenna,
wherein said first conductor strip of said bow-tie antenna is integrated with said cavity resonator, and
wherein an oscillation in a terahertz frequency band is obtained from said resonant tunneling diode, said bow-tie antenna and said cavity resonator, by applying a bias voltage between said second conductor strip of said bow-tie antenna and a side surface or a top surface of said cavity resonator connected to said first conductor strip of said bow-tie antenna.

2. The high-power terahertz oscillator according to claim 1, wherein a bottom surface of said resonant tunneling diode is in contact with a top surface of said second conductor strip of said bow-tie antenna.

3. The high-power terahertz oscillator according to claim 1, wherein said first and second conductor strips of said bow-tie antenna and said cavity resonator are made of a good conductor, and said substrate is made of a semi-insulator.

4. The high-power terahertz oscillator according to claim 2, wherein said first and second conductor strips of said bow-tie antenna and said cavity resonator are made of a good conductor, and said substrate is made of a semi-insulator.

5. The high-power terahertz oscillator according to claim 1, wherein a recess is formed at said second conductor strip of said bow-tie antenna, a conductor bridge extending from said cavity resonator is connected to an upper surface of said substrate in the recess, and a stabilizing resistor is connected between said conductor bridge and a side surface of said second conductor strip of said bow-tie antenna.

6. The high-power terahertz oscillator according to claim 2, wherein a recess is formed at said second conductor strip of said bow-tie antenna, a conductor bridge extending from said cavity resonator is connected to an upper surface of said substrate in the recess, and a stabilizing resistor is connected between said conductor bridge and a side surface of said second conductor strip of said bow-tie antenna.

7. The high-power terahertz oscillator according to claim 3, wherein a recess is formed at said second conductor strip of said bow-tie antenna, a conductor bridge extending from said cavity resonator is connected to an upper surface of said substrate in the recess, and a stabilizing resistor is connected between said conductor bridge and a side surface of said second conductor strip of said bow-tie antenna.

8. The high-power terahertz oscillator according to claim 4, wherein a recess is formed at said second conductor strip of said bow-tie antenna, a conductor bridge extending from said cavity resonator is connected to an upper surface of said substrate in the recess, and a stabilizing resistor is connected between said conductor bridge and a side surface of said second conductor strip of said bow-tie antenna.

* * * * *